United States Patent
Hashemi et al.

(10) Patent No.: US 9,865,511 B2
(45) Date of Patent: Jan. 9, 2018

(54) FORMATION OF STRAINED FINS IN A FINFET DEVICE

(71) Applicant: International Business Machines Corporation, Armonk, NY (US)

(72) Inventors: Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/263,836

(22) Filed: Sep. 13, 2016

(65) Prior Publication Data

US 2016/0379895 A1    Dec. 29, 2016

Related U.S. Application Data

(63) Continuation of application No. 14/615,621, filed on Feb. 6, 2015, now Pat. No. 9,472,575.

(51) Int. Cl.
*H01L 21/84* (2006.01)
*H01L 27/12* (2006.01)
(Continued)

(52) U.S. Cl.
CPC ........ *H01L 21/845* (2013.01); *H01L 21/0245* (2013.01); *H01L 21/02236* (2013.01); *H01L 21/02255* (2013.01); *H01L 21/02532* (2013.01); *H01L 21/02612* (2013.01); *H01L 21/02636* (2013.01); *H01L 21/02664* (2013.01); *H01L 21/2251* (2013.01); *H01L 21/2254* (2013.01);
(Continued)

(58) Field of Classification Search
CPC .......... H01L 27/1211; H01L 21/02532; H01L 29/165; H01L 21/845; H01L 21/76224; H01L 29/7849; H01L 21/308; H01L 29/0653; H01L 21/30625; H01L 21/324; H01L 21/02636; H01L 21/30604; H01L 21/2251

See application file for complete search history.

(56) References Cited

U.S. PATENT DOCUMENTS 5,847,419 A * 12/1998 Imai ................... H01L 27/0605
                                                                257/190
6,350,993 B1 * 2/2002 Chu .................... H01L 29/1025
                                                                257/18

(Continued)

OTHER PUBLICATIONS

Appendix P, List of IBM Patents or Patent Applications Treated as Related, 2 pages, dated Sep. 29, 2016.

*Primary Examiner* — Jarrett Stark
(74) *Attorney, Agent, or Firm* — Bryan D. Wells (57) ABSTRACT

In an aspect of the present invention, a field-effect transistor (FET) structure is formed. The FET structure comprises a plurality of fins formed on a semiconductor substrate, wherein the plurality of fins includes a set of fins that include a base portion that is comprised of relaxed silicon-germanium (SiGe) and an upper portion that is comprised of semiconductor material. In one aspect, a first set of one or more fins that include an upper portion comprised of a first semiconductor material. In another aspect, a second set of one or more fins that include an upper portion comprised of a second semiconductor material.

11 Claims, 8 Drawing Sheets (51) Int. Cl.

| | |
|---|---|
| *H01L 21/02* | (2006.01) |
| *H01L 21/308* | (2006.01) |
| *H01L 21/324* | (2006.01) |
| *H01L 21/306* | (2006.01) |
| *H01L 21/762* | (2006.01) |
| *H01L 21/225* | (2006.01) |
| *H01L 29/165* | (2006.01) |
| *H01L 29/78* | (2006.01) |
| *H01L 29/06* | (2006.01) |
| *H01L 29/66* | (2006.01) |

(52) U.S. Cl.
CPC ...... *H01L 21/308* (2013.01); *H01L 21/30604* (2013.01); *H01L 21/30625* (2013.01); *H01L 21/324* (2013.01); *H01L 21/76224* (2013.01); *H01L 27/1211* (2013.01); *H01L 29/0653* (2013.01); *H01L 29/165* (2013.01); *H01L 29/66795* (2013.01); *H01L 29/785* (2013.01); *H01L 29/7849* (2013.01)

(56) References Cited

U.S. PATENT DOCUMENTS

| | | | |
|---|---|---|---|
| 6,867,433 B2* | 3/2005 | Yeo | H01L 21/84 257/350 |
| 6,872,641 B1 | 3/2005 | Chidambarrao et al. | |
| 6,900,502 B2* | 5/2005 | Ge | H01L 21/76264 257/340 |
| 7,101,742 B2* | 9/2006 | Ko | H01L 21/823807 257/E21.633 |
| 7,241,670 B2 | 7/2007 | Tweet et al. | |
| 7,301,206 B2* | 11/2007 | Yeo | H01L 21/84 257/369 |
| 7,473,967 B2 | 1/2009 | Sorada et al. | |
| 7,525,154 B2 | 4/2009 | Nagano et al. | |
| 7,749,842 B2 | 7/2010 | Zhu et al. | |
| 7,960,794 B2 | 6/2011 | Doyle et al. | |
| 7,964,865 B2 | 6/2011 | Chidambarrao et al. | |
| 8,765,546 B1 | 7/2014 | Hung et al. | |
| 8,900,973 B2* | 12/2014 | Berliner | H01L 21/845 257/E21.327 |
| 8,927,363 B2* | 1/2015 | Cheng | H01L 27/1203 438/149 |
| 2002/0168864 A1* | 11/2002 | Cheng | H01L 21/76256 438/725 |
| 2003/0006461 A1* | 1/2003 | Tezuka | H01L 29/1054 257/347 |
| 2005/0040444 A1* | 2/2005 | Cohen | H01L 21/823412 257/288 |
| 2005/0093154 A1* | 5/2005 | Kottantharayil | H01L 29/1054 257/745 |
| 2006/0266996 A1* | 11/2006 | Irisawa | H01L 21/84 257/19 |
| 2007/0235759 A1* | 10/2007 | Henson | H01L 21/2807 257/192 |
| 2007/0241367 A1* | 10/2007 | Ouyang | H01L 29/778 257/190 |
| 2007/0241399 A1* | 10/2007 | Irisawa | H01L 29/66795 257/347 |
| 2007/0264801 A1* | 11/2007 | Cody | C23C 16/22 438/478 |
| 2008/0001171 A1* | 1/2008 | Tezuka | H01L 21/823807 257/191 |
| 2009/0017602 A1* | 1/2009 | Damlencourt | H01L 21/0242 438/481 |
| 2011/0024804 A1* | 2/2011 | Chang | H01L 29/165 257/288 |
| 2011/0108943 A1* | 5/2011 | Dennard | H01L 21/76254 257/506 |
| 2011/0147840 A1 | 6/2011 | Cea et al. | |
| 2011/0212600 A1* | 9/2011 | Wang | H01L 21/02381 438/478 |
| 2014/0048881 A1* | 2/2014 | Kanike | H01L 29/66545 257/347 |
| 2015/0028426 A1 | 1/2015 | Ching et al. | |
| 2015/0318355 A1* | 11/2015 | Wang | H01L 29/1054 438/479 |
| 2016/0233245 A1 | 8/2016 | Hashemi et al. | |

* cited by examiner

FORMATION OF STRAINED FINS IN A FINFET DEVICE

BACKGROUND OF THE INVENTION

The present invention relates generally to the field of semiconductor devices, and more particularly to the formation of strained fins on relaxed silicon-germanium (SiGe).

Field-effect transistors (FETs) can be semiconductor devices fabricated on a bulk semiconductor substrate or on a silicon-on-insulator (SOI) substrate. FET devices generally consist of a source, a drain, a gate, and a channel between the source and the drain. The gate is separated from the channel by a thin insulating layer, typically of silicon oxide, called the gate oxide. A voltage applied between the source and the gate induces an electric field that modulates the conductivity of the channel between the source and the drain thereby controlling the current flow between the source and the drain. Current integrated circuit designs use complementary metal-oxide-semiconductor (CMOS) technology that use complementary and symmetrical pairs of p-type and n-type metal oxide semiconductor field-effect transistors (MOSFETs) for logic functions.

Silicon-germanium (SiGe) is a general term for the alloy $Si_{1-x}Ge_x$, which consists of any molar ratio of silicon (Si) and germanium (Ge). SiGe can be used as a semiconductor material in integrated circuits as a strain-inducing layer for CMOS transistors. SiGe is manufactured on silicon wafers using conventional silicon processing toolsets.

SUMMARY

One aspect of the present invention discloses a method for fabrication of a field-effect transistor (FET) structure. The method includes depositing a first mask on a semiconductor substrate. The method further includes epitaxially growing silicon-germanium (SiGe) on a portion of the semiconductor substrate that is not covered by the deposited first mask. The method further includes performing germanium (Ge) condensation on the epitaxially grown SiGe, wherein the Ge condensation diffuses Ge down into the underlying semiconductor substrate, which forms an area of SiGe in the semiconductor substrate. The method further includes removing oxide that is a result of the performed Ge condensation and removing the deposited first mask. The method further includes depositing a second mask on the semiconductor substrate. The method further includes etching the deposited second mask layer, an area of SiGe in the semiconductor substrate, and an area of semiconductor substrate to form one or more fins. The method further includes depositing oxide, wherein the deposited oxide fills in etched away areas of the area of SiGe in the semiconductor substrate, the area of the semiconductor substrate, and the deposited second mask. The method further includes performing a thermal anneal process to relax SiGe.

Another aspect of the present invention discloses a field-effect transistor (FET) structure. The FET structure comprises a plurality of fins formed on a semiconductor substrate, wherein the plurality of fins includes a set of fins that include a base portion that is comprised of relaxed silicon-germanium (SiGe) and an upper portion that is comprised of semiconductor material. In one aspect, a first set of one or more fins that include an upper portion comprised of a first semiconductor material. In another aspect, a second set of one or more fins that include an upper portion comprised of a second semiconductor material.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative and not restrictive. Further, the Figures are not necessarily to scale, some features may be exaggerated to show details of particular components. Therefore, specific structural and functional details disclosed herein are not to be interpreted as limiting but merely as a representative basis for teaching one skilled in the art to variously employ the methods and structures of the present disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the disclosed structures and methods, as oriented in the drawing figures. The terms "overlying," "atop," "on," "positioned on," or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating, or semiconductor layers at the interface of the two elements.

Some embodiments of the present invention recognize that high germanium (Ge) content silicon-germanium (SiGe) and highly strained silicon (Si) in a fin-type architecture can be beneficial in continuing the trend of performance scaling in future complementary metal-oxide-semiconductor (CMOS) generations. Some structures and methods are capable of growing such materials on buffer layers formed by aspect ratio trapping or grading techniques, but a problem with such co-integration is that defects can occur in the buffer layer, which can result in junction leakage.

Embodiments of the present invention generally provide a structure and method of formation on silicon on insulator (SOI) to have relaxed Si, strained high-germanium (high-Ge) content SiGe on relaxed lower content for pFET, and strained-Si on relaxed SiGe for nFET. The structure can be formed by loosening SiGe/SiO$_2$ bonds through an annealing process to the SiGe in the trench of the field-effect transistor (FET).

Figure 1:
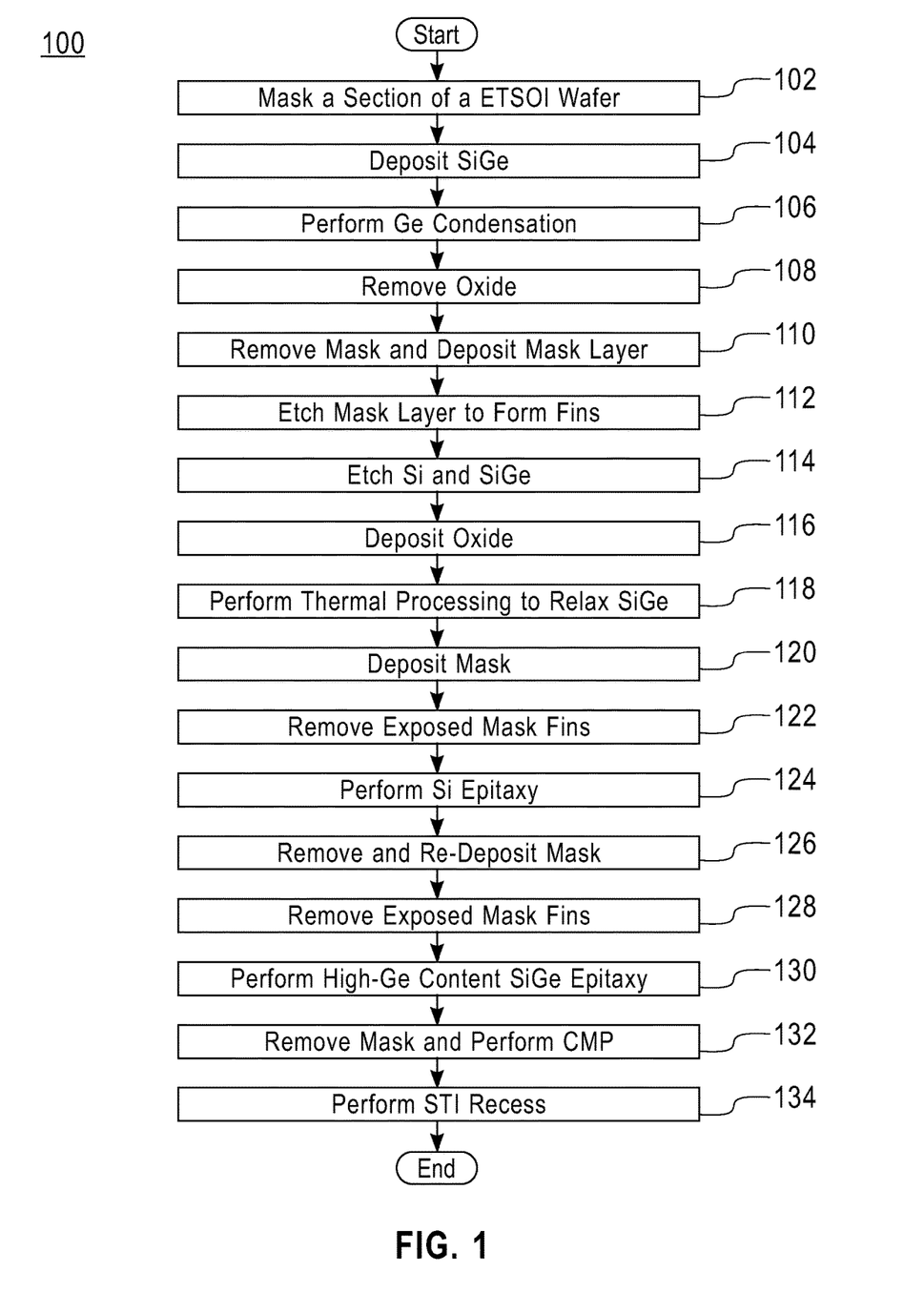
FIG. 1 depicts a flowchart illustrating an exemplary method of fabricating a field-effect transistor (FET), in accordance with embodiments of the present invention.

The present invention will now be described in detail with reference to the Figures. FIG. 1 is a functional block diagram illustrating fabrication process 100, an exemplary method for fabricating a FET, in accordance with one embodiment of the present invention.

In step 102, fabrication process 100 masks a section of an extremely thin SOI (ETSOI) wafer. In one embodiment, fabrication process 100 deposits a hard mask layer onto a section of an ETSOI (e.g., 5 nanometer thickness). In an example embodiment, the ETSOI is partitioned into a plurality of isolated sections, and fabrication process 100 masks the ETSOI to cover one or more of the isolated sections. In an example with regard to ETSOI 200 (depicted in FIG. 2A), fabrication process 100 masks a section of ETSOI 200. ETSOI 200 includes substrate 201, buried oxide (BOX) 202, and silicon (Si) sections 203 and 204. In one embodiment, ETSOI 200 is divided into two sections of Si (i.e., Si sections 203 and 204). In various embodiments, the sections can be separated with another material (e.g., cutting away Si and depositing a different material) or separated with an absence of Si (e.g., cutting away Si and leaving an open area between Si sections 203 and 204). For example, Si sections 203 and 204 can be isolated because the sections correspond to different elements of circuit blocks (e.g., static random-access memory (SRAM), circuit logic, I/O, etc.).

Figure 2A:
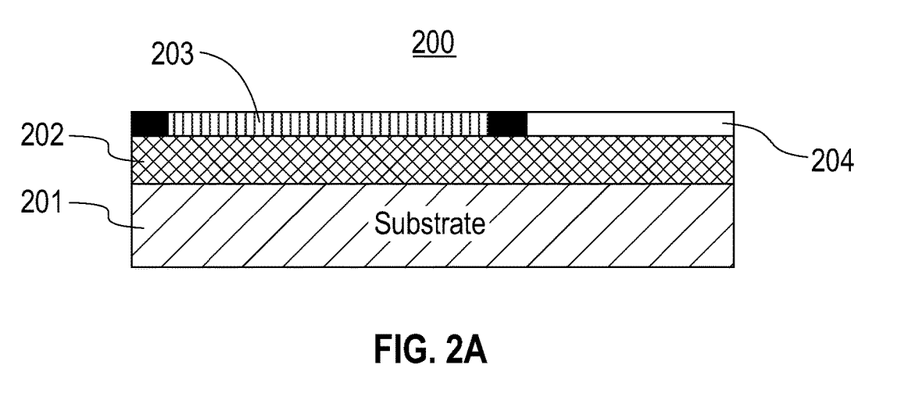
FIG. 2A depicts a cross-sectional view of an extremely thin SOI (ETSOI) wafer with a top layer divided into two sections, in accordance with embodiments of the invention.

Substrate 201 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si, and combinations and multi-layers thereof. Substrate 201 may also be composed of other semiconductor materials, such as germanium and compound semiconductor substrates, such as type III/V semiconductor substrates, e.g., GaAs. Although substrate 201 is depicted as a bulk semiconductor substrate, semiconductor on insulator (SOI) substrate arrangements, such as silicon on insulator substrates, are also suitable for substrate 201. In additional embodiments, substrate 201 contains a dielectric coating over the bulk semiconductor to isolate the source/drain/gate metals, keeping the source/drain/gate metals from shorting. The dielectric coating can be SiO$_2$ (thermal, plasma-enhanced chemical vapor deposition (PECVD), (low temperature oxide (LTO)), Al$_2$O$_3$ or HfO$_2$ (e.g., atomic layer deposition (ALD) deposited), Si$_3$N$_4$ (silicon nitride), etc. In another embodiment, substrate 201 is a sapphire substrate (e.g., Al$_2$O$_3$ bulk).

In various embodiments, BOX 202 can be silicon oxide (SiO$_2$) that acts to insulate Si sections 203 and 204 from substrate 201 (e.g., with a typical thickness of about 10 nm to about 500 nm). BOX 202 can be formed by thermally oxidizing the exposed surface of substrate 201 or may be deposited onto substrate 201 using, for example, chemical vapor deposition (CVD) or atomic layer deposition (ALD). Si sections 203 and 204 can then be bonded to BOX 202.

Figure 2B:
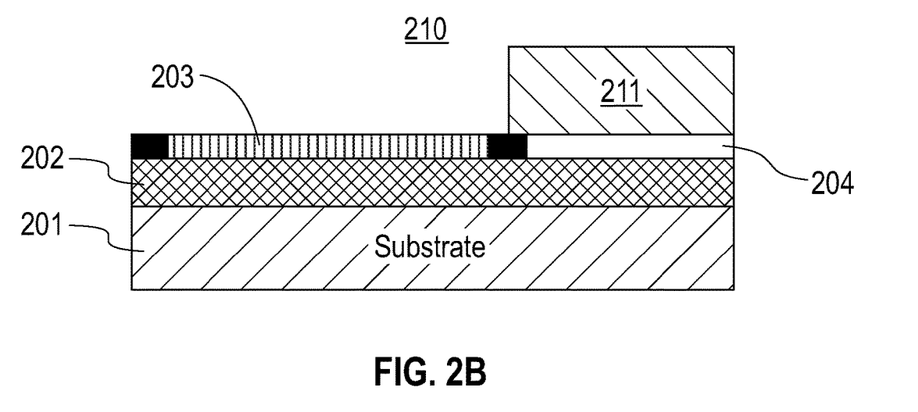
FIG. 2B depicts a cross-sectional view of a deposition of a hard mask on a portion of the ETSOI of FIG. 2A, in accordance with embodiments of the invention.

In an example with regard to FET 210 (depicted in FIG. 2B), fabrication process 100 deposits hard mask 211 onto Si section 204, which masks Si section 204 (step 102). In another example, fabrication process 100 can instead deposit a hard mask layer covering Si section 203. In various embodiments, hard mask 211 can be silicon nitride (SiN) with a typical thickness of about 10 nm, deposited using, for example, low pressure chemical vapor deposition (LPCVD). Hard mask 211 can be any hard mask material that can act as an etch mask during the patterning of Si sections 203 and 204 (e.g., a nitride, oxide/nitride stack, titanium nitride, silicon nitride, silicon dioxide, silicon carbide, silicon carbide nitride, etc.), as described in further detail in fabrication process 100.

In step 104, fabrication process 100 deposits SiGe. In one embodiment, fabrication process 100 deposits SiGe, via selective epitaxy, onto the area of the ETSOI wafer that is not covered by the hard mask (deposited in step 102). For example, fabrication process 100 grows a SiGe epitaxial layer from the exposed portion of the ETSOI (e.g., via selective epitaxy). In other embodiments, fabrication process 100 can utilize various other forms of epitaxial growth. In example embodiments, fabrication process 100 deposits SiGe with the content of Si$_{1-x}$Ge$_x$, where x can be 0.2 to 0.7, nominally x=0.5.

Figure 2C:
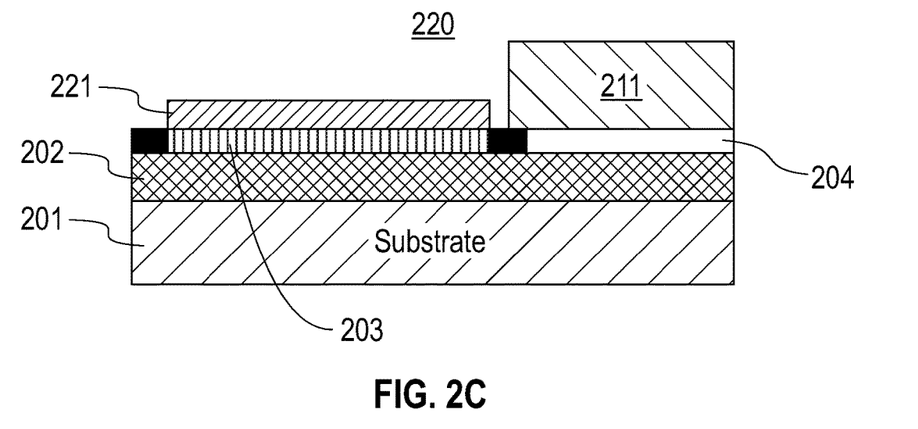
FIG. 2C depicts a cross-sectional view of a deposition of silicon-germanium (SiGe) on a portion of the ETSOI of FIG. 2B, in accordance with embodiments of the invention.

In an example with regard to FET 220 (depicted in FIG. 2C), fabrication process 100 utilizes selective epitaxy to grow SiGe layer 221 onto Si section 203 (i.e., the exposed Si section). SiGe layer 221 is comprised of defect-free strained SiGe. Fabrication process 100 grows SiGe layer 221 onto the area of FET 210 that is not covered by hard mask 211, i.e., Si section 203.

In step 106, fabrication process 100 performs Ge condensation. In one embodiment, fabrication process 100 heats the FET, including the SiGe layer (from step 104), into an oven (or furnace or other means of applying heat to the FET) to heat the FET. Heating the FET oxidizes the Si in the SiGe layer and diffuses the Ge down into the underlying Si layer. Fabrication process 100 can repeat the Ge condensation process until enough Ge is diffused to reach the desired concentration level of SiGe (e.g., 97%, 80%, or other amounts depending on the desired content).

Figure 2D:
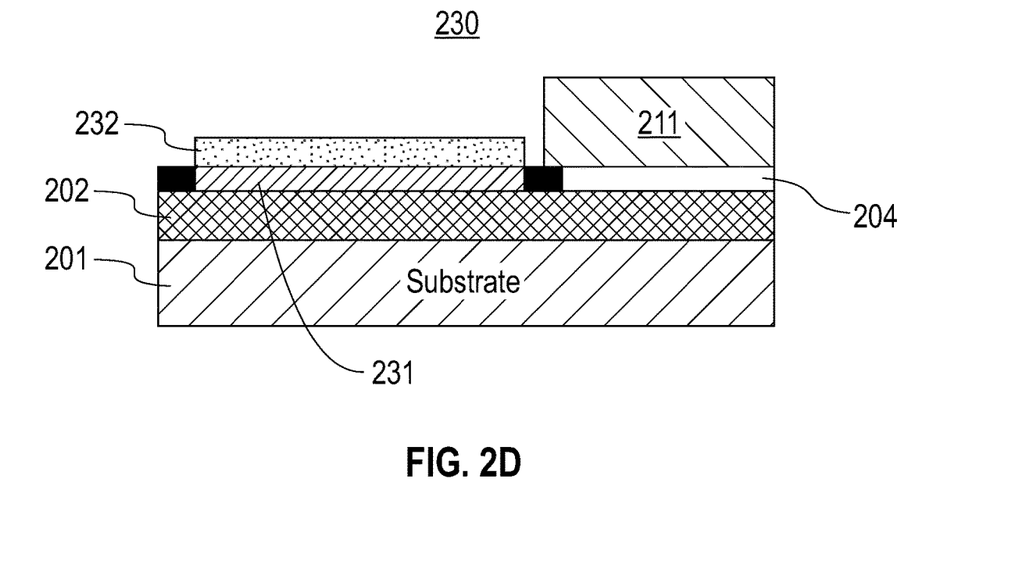
FIG. 2D depicts a cross-sectional view of Germanium condensation process on the ETSOI of FIG. 2C, in accordance with embodiments of the invention.

In an example with regard to FET 230 (depicted in FIG. 2D), fabrication process 100 performs Ge condensation, creating SiGe layer 231 and oxide layer 232. Fabrication process 100 performs GE condensation on FET 220 (FIG. 2C), which results in FET 230 (FIG. 2D). In one embodiment, SiGe layer 231 is comprised of defect-free strained SiGe (at a desired content level achieved through the Ge condensation process), and oxide layer 232 is $SiO_2$. In this example, the Ge condensation process diffuses Ge in SiGe layer 221 (of FET 220) down into Si section 203, which results in SiGe layer 231 and oxide layer 232 (of FET 230). In various embodiments, oxide layer 232 can consist of similar or different substances than BOX 202.

In step 108, fabrication process 100 removes the oxide layer. In one embodiment, fabrication process 100 removes the layer of oxide that resulted from the GE condensation process (performed in step 106). In an example with regard to FET 230 (depicted in FIG. 2D), fabrication process 100 strips away oxide layer 232.

In step 110, fabrication process 100 removes the mask and deposits a mask layer. In one embodiment, fabrication process 100 removes the hard mask (deposited in step 102) and deposits a new hard mask layer that overlays the FET. In another embodiment, fabrication process 100 removes the oxide layer (step 108) and removes the hard mask layer (deposited in step 102) simultaneously.

Figure 3A:
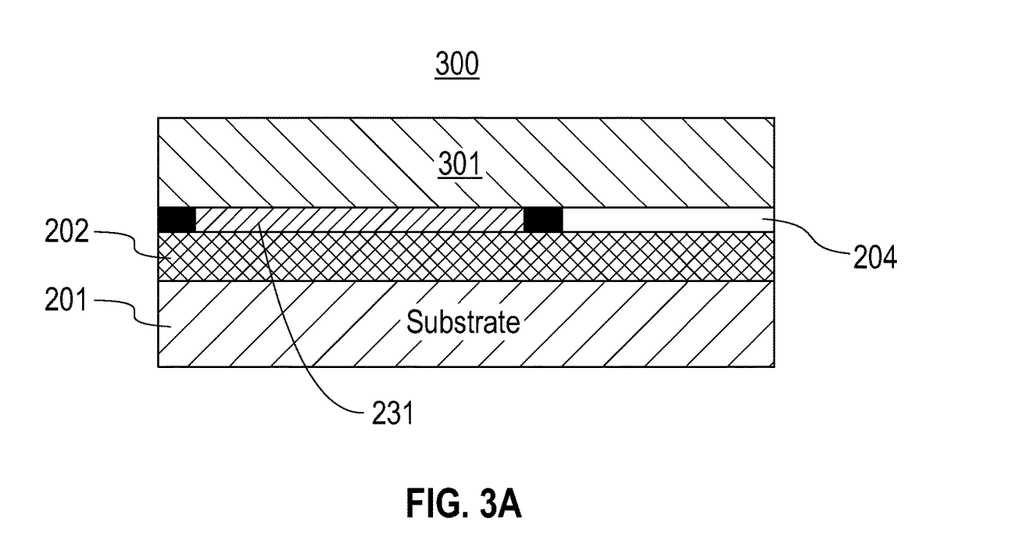
FIG. 3A depicts a cross-sectional view of a hard mask layer overlaying a FET, in accordance with embodiments of the invention.

In an example with regard to FET 300 (depicted in FIG. 3A), fabrication process 100 removes hard mask 211 (depicted in FET 230) and deposits hard mask layer 301. Fabrication process 100 deposits hard mask layer 301 as a top layer of FET 300, overlaying and therefore masking SiGe layer 231 and Si section 204. In various embodiments, hard mask layer 301 can be silicon nitride (SiN) with a typical thickness of about 10 nm, deposited using, for example, low pressure chemical vapor deposition (LPCVD). Hard mask layer 301 can be any hard mask material that can act as an etch mask during the patterning of SiGe layer 231 and Si section 204 (e.g., a nitride, oxide/nitride stack, titanium nitride, silicon nitride, silicon dioxide, silicon carbide, silicon carbide nitride, etc.), as described in further detail in fabrication process 100.

In step 112, fabrication process 100 etches the mask layer to form fins. In one embodiment, fabrication process 100 etches the mask layer (deposited in step 110) to form a plurality of fins. In example embodiments, fabrication process 100 etches the hard mask utilizing reactive-ion etching (RIE) or other lithography techniques to form fins (e.g., chlorine-based RIE chemistry, Argon (Ar) milling, etc.). In various embodiments, fabrication process 100 etches through hard mask layer 301 and not through the underlying layers of SiGe layer 231 and Si section 204.

Figure 3B:
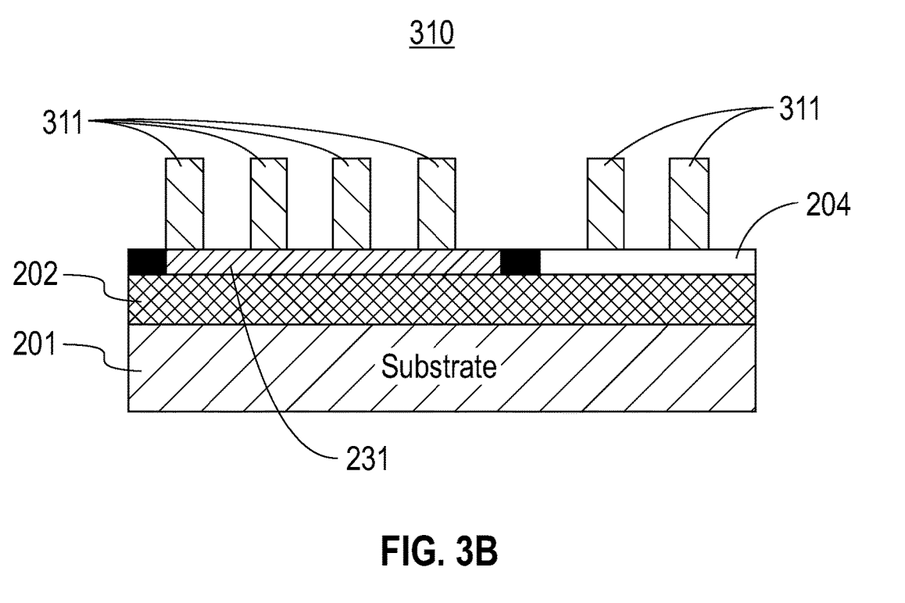
FIG. 3B depicts a cross-sectional view of the hard mask layer of FIG. 3A etched to form hard mask fins, in accordance with embodiments of the invention.

In an example, fabrication process 100 etches the hard mask layer (e.g., hard mask layer 301 in FET 300) to pattern and form hard mask fins 311 in FET 310 (depicted in FIG. 3B). Fabrication process 100 etches away portions of the hard mask to form hard mask fins 311, which cover portions of SiGe layer 231 and Si section 204.

In step 114, fabrication process 100 etches the Si and SiGe. In one embodiment, fabrication process 100 etches the Si and SiGe layers in the FET in the same manner that fabrication process 100 etched the hard mask layer (in step 112). In example embodiments, fabrication process 100 etches the Si and SiGe layers utilizing reactive-ion etching (RIE) or other lithography techniques to form fins (e.g., chlorine-based RIE chemistry, Argon (Ar) milling, etc.). In another embodiment, fabrication process 100 can perform the etching processes of steps 112 and 114 simultaneously to form fin structures on the FET. In various embodiments, fabrication process 100 etches through the SiGe and Si layers down to the underlying BOX layer.

Figure 3C:
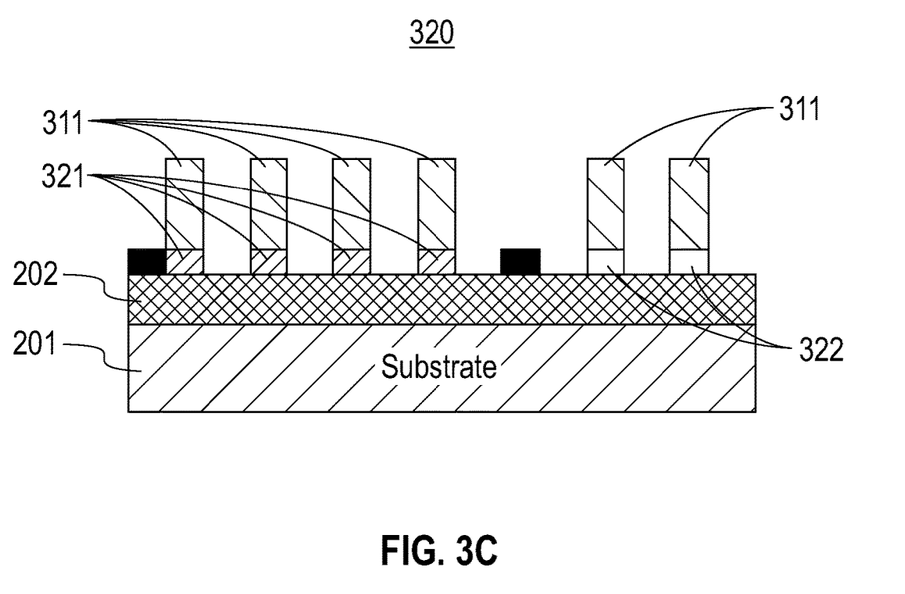
FIG. 3C depicts a cross-sectional view of an etching of the FET structure of FIG. 3B, in accordance with embodiments of the invention.

In an example, fabrication process 100 etches the Si and SiGe in the FET (e.g., SiGe layer 231 and Si section 204 in FET 310) to form SiGe fins 321 and Si fins 322, which form the bottom portion of hard mask fins 311 (depicted in FIG. 3C). Fabrication process 100 etches exposed portions of SiGe layer 231 and Si section 204 down to BOX 202, which results in SiGe fins 321 and Si fins 322. In various embodiments, SiGe fins 321 are comprised of defect-free partially strained SiGe.

In step 116, fabrication process 100 deposits oxide. In one embodiment, fabrication process 100 deposits oxide filling in the areas of the FET etched away in steps 112 and 114 (i.e., in the gaps of the FET not populated by the fins). In an example embodiment, fabrication process 100 can deposit $SiO_2$ or another oxide (e.g., the same oxide as the BOX layer). In another embodiment, fabrication process 100 deposits the oxide, filling in open areas of the FET, and facilitating the shallow trench isolation (STI) process occurring in the following steps of fabrication process 100.

Figure 4A:
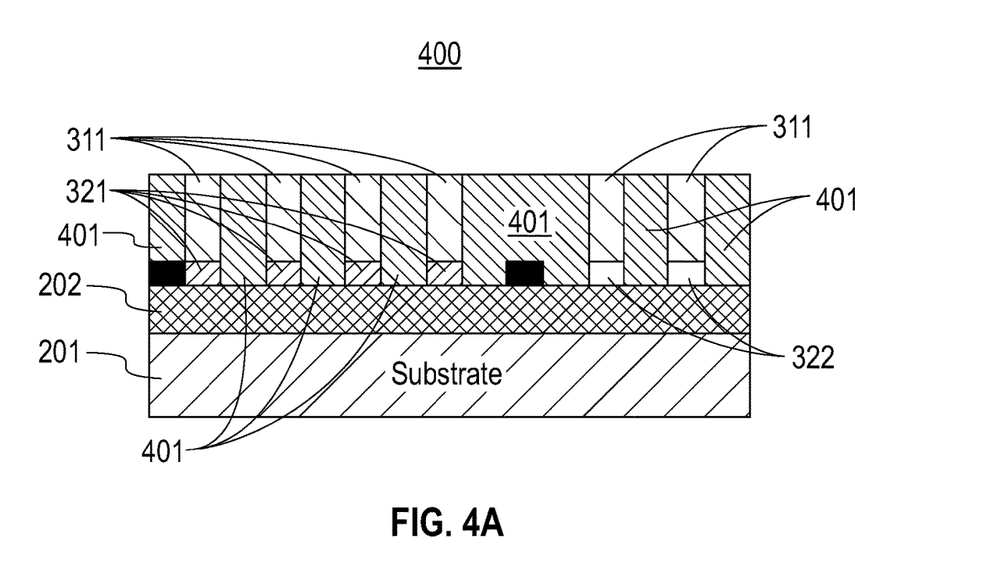
FIG. 4A depicts a cross-sectional view of a deposition of oxide onto the FET structure of FIG. 3C, in accordance with embodiments of the invention.

In an example, fabrication process 100 deposits oxide (e.g., $SiO_2$) in the areas of FET 320 that are not populated by hard mask fins 311, SiGe fins 321, and Si fins 322, which forms FET 400 (depicted in FIG. 4A). FET 400 includes deposited oxide 401, which fills in the gaps in the FET (i.e., the trenches in FET 320 formed in steps 112 and 114).

In step 118, fabrication process 100 performs a thermal anneal to relax the SiGe. In one embodiment, fabrication process 100 performs a thermal anneal on the FET, relaxing (at least) the SiGe, which initially was partially strained. The thermal anneal allows the SiGe to relax in all directions (e.g., along the length of the fin). In one embodiment, the thermal anneal allows the SiGe to relax because the SiGe has a weaker bond to oxide than Si and has a lower melting temperature than Si. Fabrication process 100 utilizes a high-enough thermal process (e.g., thermal annealing in a furnace, laser anneal, etc.) to weaken the bonds, which relaxes the strain in the SiGe, which results in defect-free relaxed SiGe.

Figure 4B:
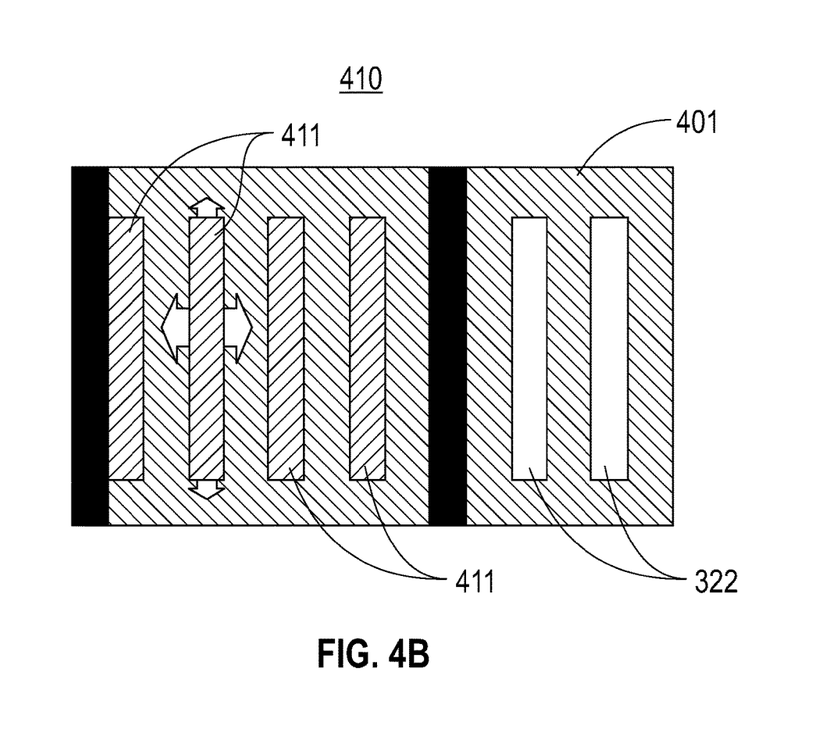
FIG. 4B depicts a top-down view of the FET structure of FIG. 4A undergoing a thermal anneal, in accordance with embodiments of the invention.

In an example with regard to FET 400 (FIG. 4A), fabrication process 100 performs a thermal anneal, which relaxes SiGe fins 321. FIG. 4B depicts FET 410, which is a top-down view of a cross-section to FET 400 undergoing the thermal anneal process (a cross-sectional view to expose the SiGe fins). FET 410 includes relaxed SiGe fins 411, which have been relaxed in all directions (including in and out of the drawing plane), as indicated by the arrows in FET 410. In one embodiment, the up and down arrows (i.e., arrows along the fin length) indicate stress relaxation due to the thermal anneal. In another embodiment, the left and right arrows indicate stress relaxation due to the thermal anneal or prior to the thermal anneal due to edge-induced free surface elastic relaxation.

In step 120, fabrication process 100 deposits a mask. In one embodiment, fabrication process 100 deposits a hard mask covering a portion of the FET. For example, fabrication process 100 deposits a hard mask covering the fins in the FET that will be the location of the SiGe fins (discussed later in fabrication process 100).

In an example with regard to FET 500 (FIG. 5A), fabrication process 100 deposits hard mask 501 covering one or more of hard mask fins 311. For example, fabrication process 100 deposits hard mask 501 covering FET 500 but leaving open the area designated for Si epitaxy (e.g., the nFET, SRAM, I/O, etc.). In another embodiment, fabrication process 100 deposits hard mask 501 covering FET 500 but leaving open the area designated for SiGe epitaxy (discussed later in step 130).

In step 122, fabrication process removes exposed mask fins. In one embodiment, fabrication process 100 removes (e.g., etches away, forming a shallow trench) the hard mask fins that are not covered by hard mask deposited in step 120. In example embodiments, fabrication process 100 etches the hard mask utilizing reactive-ion etching (RIE) or other lithography techniques to form fins (e.g., chlorine-based RIE chemistry, Argon (Ar) milling, etc.).

Figure 5A:
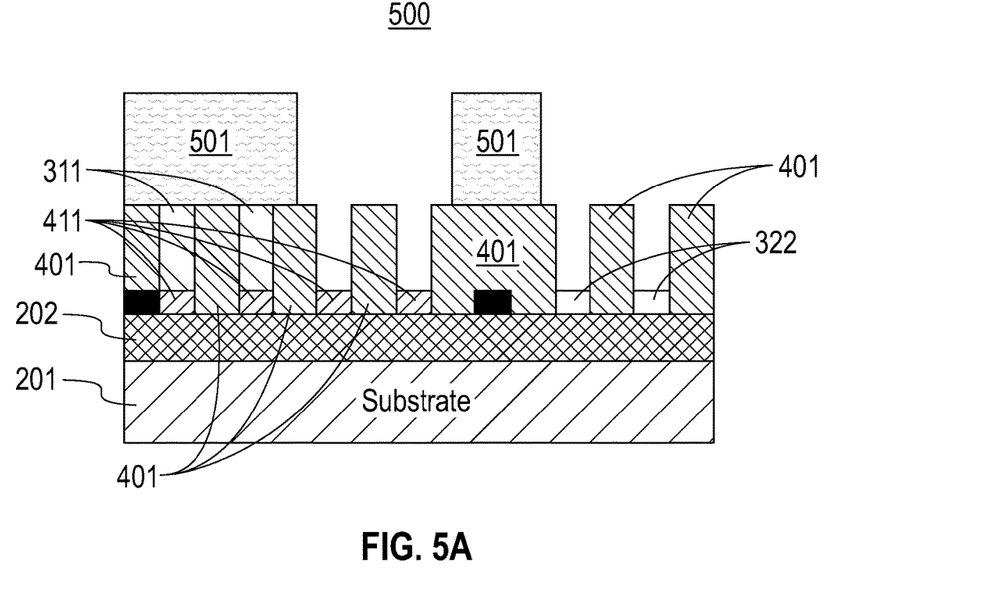
FIG. 5A depicts a cross-sectional view of an etching away of hard mask fins of the FET structure of FIG. 4B, in accordance with embodiments of the invention.

In an example, fabrication process 100 removes the hard mask fins that are not masked by hard mask 501 (i.e., hard mask fins 311 in FET 500). Fabrication process 100 removes the exposed hard mask fins, which results in exposing relaxed SiGe fins 411 and Si fins 322. In one embodiment, hard mask 501 is a different material than hard mask fins 311 (e.g., a different nitride), which allows fabrication process 100 to etch away the exposed hard mask fins but not hard mask 501. In another embodiment, hard mask 501 and hard mask fins 311 are the same material, but hard mask 501 can be a greater thickness than hard mask fins 311, which allows fabrication process 100 to etch away the exposed hard mask fins without completely etching away hard mask 501.

In step 124, fabrication process 100 performs Si epitaxy. In one embodiment, fabrication process 100 performs Si epitaxy to grow Si fins in areas (e.g., the etched away trenches) of the FET formed by removing the hard mask fins (removed in step 124). For example, fabrication process 100 grows fins composed of defect-free Si at a length of approximately 15 nm. In another embodiment, fabrication process 100 performs epitaxy to grow the Si fins under the critical volume. In various embodiments, fabrication process 100 performs Si epitaxy to grow Si fins, strained Si fins, or a combination of Si fins and strained Si fins.

Figure 5B:
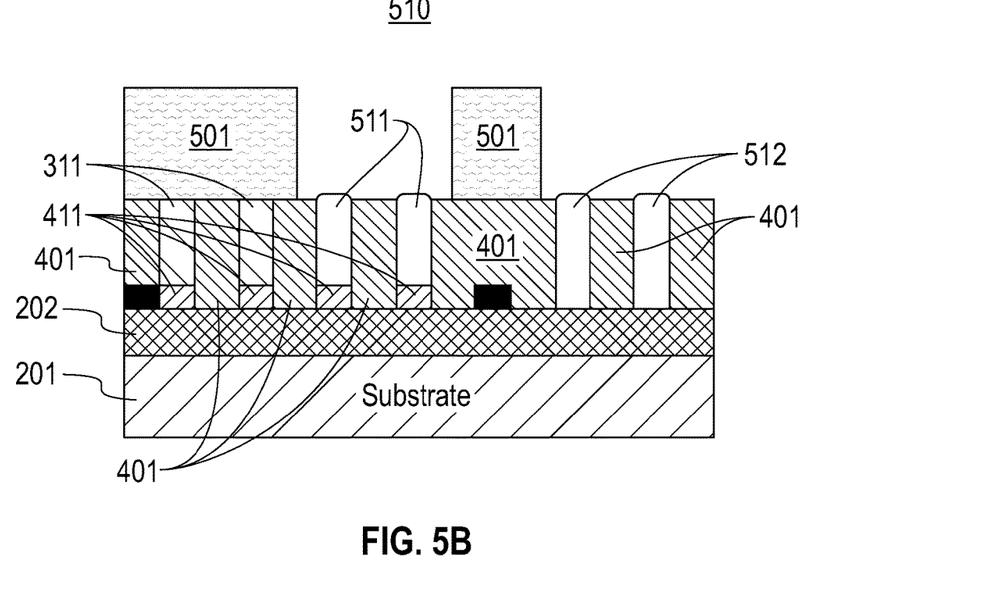
FIG. 5B depicts a cross-sectional view of a growth of silicon fins in the FET structure of FIG. 5A, in accordance with embodiments of the invention.

In an example, fabrication process 100 utilizes Si epitaxy to grow Si fins 511 and 512 in FET 510 (depicted in FIG. 5B). Fabrication process 100 grows Si fins 511 and 512 in the etched away trenches (formed in step 122) of FET 500 (FIG. 5A). Hard mask 501 (deposited in step 120) masks the portions of the FET that are not intended to undergo Si epitaxy. In one embodiment, fabrication process 100 grows Si fins 511, composed of strained Si, on top of relaxed SiGe fins 411, which makes relaxed SiGe fins 411 the base of Si fins 511 (e.g., a buffer between Si fins 511 and BOX 202). In another embodiment, fabrication process 100 grows Si fins 512, composed of Si, on top of Si fins 322 (depicted in FIG. 5A), which results in complete Si fins, i.e., Si fins 512.

In step 126, fabrication process 100 removes and re-deposits a mask. In one embodiment, the fabrication process removes the hard mask deposited in step 120 and deposits a new hard mask on the FET. For example, fabrication process 100 deposits a hard mask that covers the portions of the FET that include the Si fins (i.e., the fins grown in the Si epitaxy of step 124).

Figure 6A:
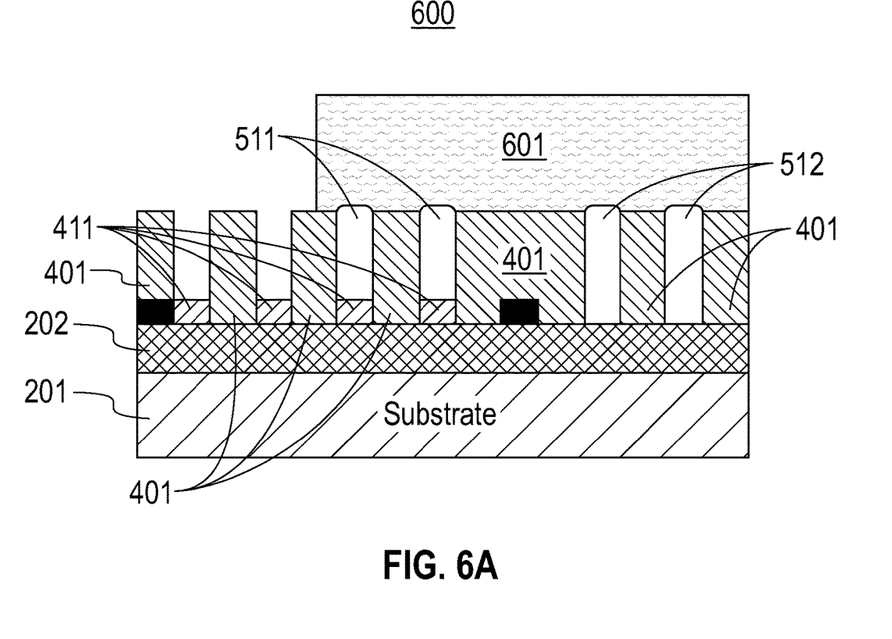
FIG. 6A depicts a cross-sectional view of an etching away of hard mask fins of the FET structure of FIG. 5B, in accordance with embodiments of the invention.

In an example, fabrication process 100 removes hard mask 501 of FET 510 and then deposits a hard mask that covers Si fins 511 and 512. FIG. 6A depicts FET 600, which includes hard mask 601 covering Si fins 511 and 512. For example, fabrication process 100 deposits hard mask 601 covering a portion of FET 600 but leaving open the area designated for SiGe epitaxy (e.g., the pFET, logic portion, etc.)

In step 128, fabrication process 100 removes exposed mask fins. In one embodiment, fabrication process 100 removes (e.g., etches away, forming a shallow trench) the hard mask fins that are not covered by hard mask deposited in step 126. In example embodiments, fabrication process 100 etches the hard mask utilizing reactive-ion etching (RIE) or other lithography techniques to form fins (e.g., chlorine-based RIE chemistry, Argon (Ar) milling, etc.).

In an example, fabrication process 100 removes the hard mask fins that are not masked by hard mask 601 (i.e., hard mask fins 311 in FET 510). Fabrication process 100 removes the exposed hard mask fins, which results in exposing relaxed SiGe fins 411. In one embodiment, hard mask 601 is a different material than hard mask fins 311 (e.g., a different nitride), which allows fabrication process 100 to etch away the exposed hard mask fins but not hard mask 601. In another embodiment, hard mask 601 and hard mask fins 311 are the same material, but hard mask 601 can be a greater thickness than hard mask fins 311, which allows fabrication process 100 to etch away the exposed hard mask fins without completely etching away hard mask 601.

In step 130, fabrication process 100 performs high-Ge content SiGe epitaxy. In one embodiment, fabrication process 100 performs epitaxy utilizing high-Ge content SiGe to grow SiGe fins in areas (e.g., the etched away trenches) of the FET formed by removing the hard mask fins (removed in step 128). For example, fabrication process 100 grows fins composed of defect-free high-Ge content SiGe at a length of approximately 15 nm. In another example, fabrication process 100 grows fins composed of defect-free high-Ge content strained SiGe. In various embodiments, the high-Ge content SiGe has increased Ge content (e.g., a higher percentage) relative to the SiGe in the FET formed via Ge condensation (formed in step 106 and relaxed in step 118). In another embodiment, fabrication process 100 performs epitaxy to grow the Si fins under the critical volume.

Figure 6B:
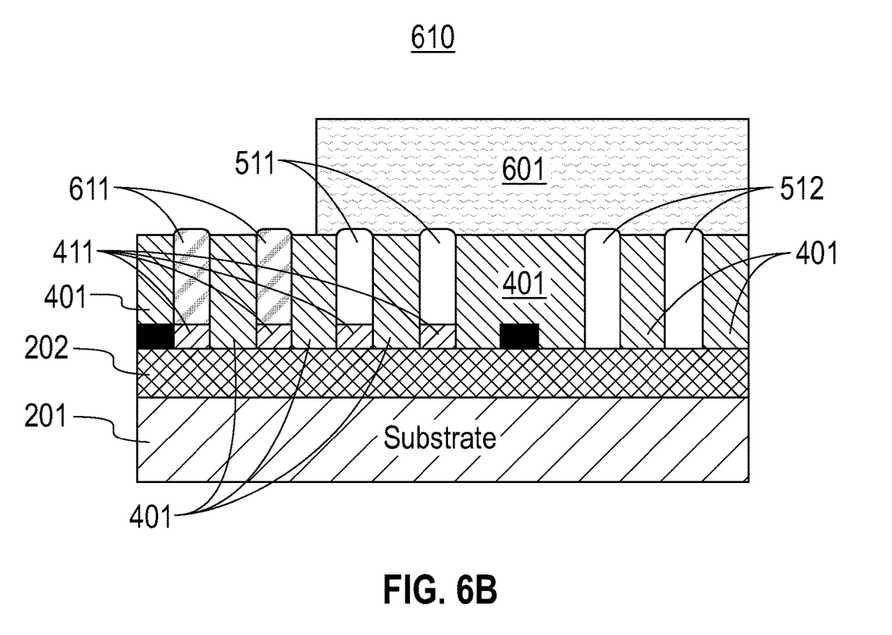
FIG. 6B depicts a cross-sectional view of a growth of SiGe fins in the FET structure of FIG. 6A, in accordance with embodiments of the invention.

In an example, fabrication process 100 performs epitaxy utilizing high-Ge content SiGe to grow high-Ge content SiGe fins 611 in FET 610 (depicted in FIG. 6B). Fabrication process 100 grows high-Ge content SiGe fins 611 in the etched away trenches (formed in step 128) of FET 600 (FIG. 6A). Hard mask 601 (deposited in step 126) masks the portions of the FET that are not intended to undergo SiGe epitaxy. In one embodiment, fabrication process 100 grows high-Ge content SiGe fins 611, composed of high-Ge content strained SiGe, on top of relaxed SiGe fins 411, which makes relaxed SiGe fins 411 the base of Si fins 511 (e.g., a buffer between high-Ge content SiGe fins 611 and BOX 202). In another embodiment, the maximum limit for GE content of high-Ge content SiGe fins 611 is pure Ge or $Ge_{1-x}Sn_x$.

In step 132, fabrication process 100 removes the mask and performs Chemical Mechanical Polishing (CMP). In one embodiment, fabrication process 100 removes the hard mask deposited in step 126 and then performs CMP on the FET. Fabrication process 100 utilizes CMP to smooth the surfaces of the FET after removing the hard mask layer. CMP (also referred to as Chemical Mechanical Planarization) utilizes a combination of chemical and mechanical forces to smooth a surface (e.g., a hybrid of chemical etching and free abrasive polishing).

Figure 7A:
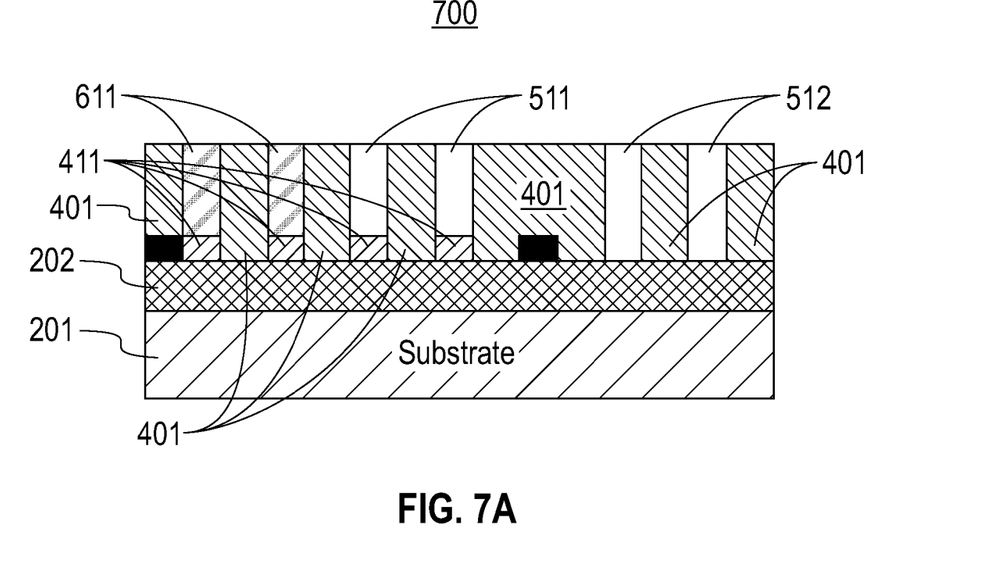
FIG. 7A depicts a cross-sectional view of a Chemical Mechanical Polishing (CMP) process on the FET structure of FIG. 6B, in accordance with embodiments of the invention.

In an example, fabrication process 100 removes hard mask 601 of FET 600 and then performs CMP on the FET, which results in FET 700 (depicted in FIG. 7A). Fabrication process 100 performs CMP on the FET, which smoothens and polishes surfaces of the FET. For example, fabrication process 100 performs CMP on the top surface of the FET, which polishes and smoothens the top surfaces of deposited oxide 401, high-Ge content SiGe fins 611, and Si fins 511 and 512.

In step 134, fabrication process 100 performs STI recess. In one embodiment, fabrication process 100 performs a shallow trench isolation (STI) recess to form and expose the fins of the FET. Fabrication process 100 recesses the oxide deposited in step 116 down to form exposed fins.

Figure 7B:
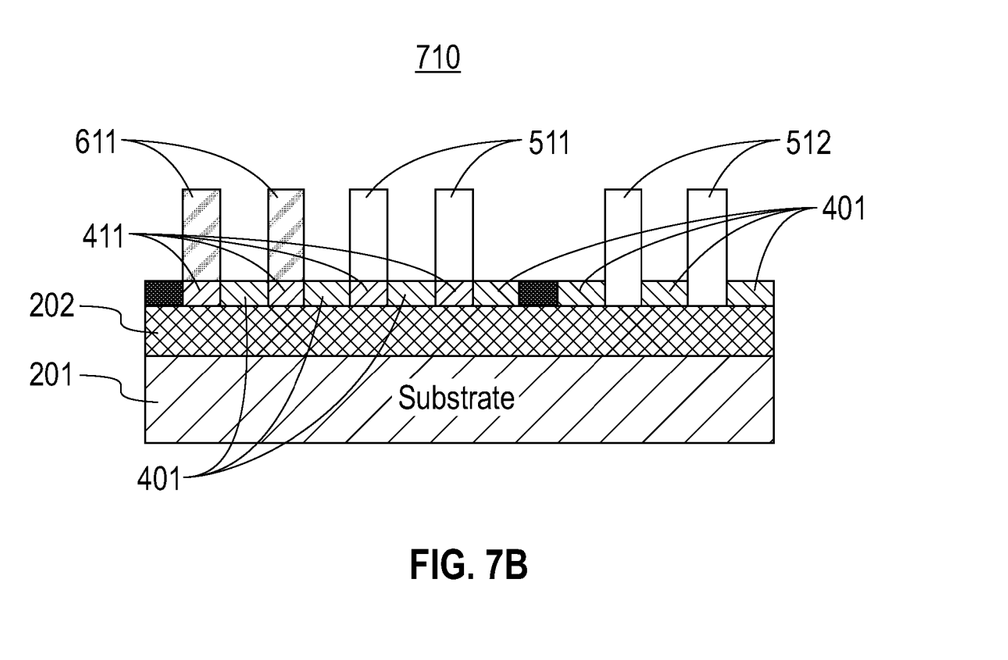
FIG. 7B depicts a cross sectional view of a shallow trench isolation (STI) recess process on the FET structure of FIG. 7A, in accordance with embodiments of the invention.

In an example, fabrication process 100 recesses (as part of the STI process) deposited oxide 401 in FET 700 to expose high-Ge content SiGe fins 611 and Si fins 511 and 512, which results in FET 710 (depicted in FIG. 7B). In an example embodiment, fabrication process 100 recesses deposited oxide 401 down to the bottom of high-Ge content SiGe fins 611 and Si fins 511, leaving an amount of deposited oxide 401 similarly equal in height to relaxed SiGe fins 411. FET 710 includes formed fins (i.e., high-Ge content SiGe fins 611 and Si fins 511 and 512) and is capable of continuing processing via conventional CMOS processing methods.

What is claimed is:

1. A method for fabricating a field-effect transistor (FET) structure, the method comprising:
    depositing a first mask on a semiconductor substrate;
    epitaxially growing silicon-germanium (SiGe) on a portion of the semiconductor substrate that is not covered by the deposited first mask;
    performing germanium (Ge) condensation on the epitaxially grown SiGe, wherein the Ge condensation diffuses Ge down into the underlying semiconductor substrate, which forms an area of SiGe in the semiconductor substrate;
    removing oxide that is a result of the performed Ge condensation and removing the deposited first mask;
    depositing a second mask on the semiconductor substrate;
    etching the deposited second mask layer, an area of SiGe in the semiconductor substrate, and an area of semiconductor substrate to form one or more fins;
    depositing oxide, wherein the deposited oxide fills in etched away areas of the area of SiGe in the semiconductor substrate, the area of the semiconductor substrate, and the deposited second mask;
    performing a thermal anneal process to relax SiGe;
    depositing a third mask that masks at least one of the one or more fins and exposes at least one of the one or more fins;
    removing a portion of the at least one exposed fin, wherein the removed portion comprises the second mask; and
    epitaxially growing a first semiconductor material in at least one trench formed by removing the portion of the at least one fin;
    removing the deposited third mask;
    depositing a fourth mask that masks at least the epitaxially grown first semiconductor material and exposes at least one of the one or more fins;
    removing a portion of the at least one exposed fin, wherein the removed portion comprises the second mask; and
    epitaxially growing a second semiconductor material in at least one trench formed by removing the portion of the at least one fin.

2. The method of claim 1, further comprising: removing the deposited fourth mask; and performing chemical mechanical polishing (CMP).

3. The method of claim 2, further comprising:
    performing a shallow trench isolation (STI) recess on the deposited oxide to expose the epitaxially grown first semiconductor material and the epitaxially grown second semiconductor material, wherein the STI recess forms a plurality of fins comprised of the first semiconductor material and the second semiconductor material.

4. The method of claim 1, further comprising
    epitaxially growing a third semiconductor material in at least one trench formed by removing the portion of the at least one fin.

5. The method of claim 1:
    wherein the semiconductor substrate is an extremely thin semiconductor on insulator (ETSOI) wafer; and
    wherein the ETSOI comprises a silicon (Si) substrate layer, a buried oxide (BOX) layer on the Si substrate, and a Si layer that is separated into one or more sections.

6. The method of claim 1, wherein the epitaxially grown SiGe is defect-free strained SiGe that is grown on the semiconductor substrate utilizing selective epitaxy.

7. The method of claim 1, wherein performing Ge condensation, further comprises:
    applying heat to oxidize Si in the epitaxially grown SiGe and diffuse Ge down into an underlying Si portion of the semiconductor substrate; and
    wherein heat is applied until enough Ge is diffused to reach a desired concentration level of SiGe.

8. The method of claim 1, wherein etching the deposited second mask layer, an area of SiGe in the semiconductor substrate, and an area of semiconductor substrate to form one or more fins, further comprises;
    utilizing a reactive ion etch (RIE) to form the one or more fins,
    wherein the one or more fins are formed to comprise a base portion comprised of an area of SiGe in the semiconductor substrate or an area of semiconductor substrate, and an upper portion comprising the deposited second mask layer.

9. The method of claim 1, wherein performing a thermal anneal process to relax SiGe, further comprises:
    performing a thermal anneal process that allows the SiGe to relax in all directions, resulting in relaxed SiGe.

10. The method of claim 1, wherein the first semiconductor material is Si.

11. The method of claim 1, wherein the second semiconductor material is high-Ge content SiGe.

* * * * *